United States Patent
Yu

(10) Patent No.: US 12,439,652 B2
(45) Date of Patent: Oct. 7, 2025

(54) MOS DEVICE WITH SANDWICH STRUCTURE AND GROOVE

(71) Applicant: HANGZHOU FULLSEMI SEMICONDUCTOR CO., LTD., Hangzhou (CN)

(72) Inventor: Qi Yu, Hangzhou (CN)

(73) Assignee: HANGZHOU FULLSEMI SEMICONDUCTOR CO., LTD., Hangzhou (CN)

( * ) Notice: Subject to any disclaimer, the term of this patent is extended or adjusted under 35 U.S.C. 154(b) by 495 days.

(21) Appl. No.: 17/966,742

(22) Filed: Oct. 14, 2022

(65) Prior Publication Data
US 2023/0163165 A1    May 25, 2023

(30) Foreign Application Priority Data
Nov. 24, 2021    (CN) .......................... 202111406269.6

(51) Int. Cl.
*H10D 64/01*    (2025.01)
*H10D 62/10*    (2025.01)
*H10D 64/27*    (2025.01)

(52) U.S. Cl.
CPC ........... *H10D 62/102* (2025.01); *H10D 64/01* (2025.01); *H10D 64/516* (2025.01); *H10D 64/518* (2025.01)

(58) Field of Classification Search
CPC .... H10D 62/102; H10D 64/01; H10D 64/516; H10D 64/518
See application file for complete search history.

(56) References Cited

U.S. PATENT DOCUMENTS

| | | | |
|---|---|---|---|
| 5,225,361 A * | 7/1993 | Kakiuchi | H10D 30/683 257/E21.422 |
| 2005/0112857 A1* | 5/2005 | Gluschenkov | H10D 62/021 438/585 |
| 2007/0069285 A1* | 3/2007 | Takami | H10D 64/683 257/E29.152 |
| 2007/0284675 A1* | 12/2007 | Kimizuka | H01L 21/28079 257/412 |

\* cited by examiner

*Primary Examiner* — Sue A Purvis
*Assistant Examiner* — Sammantha K Salaz
(74) *Attorney, Agent, or Firm* — IPRTOP LLC

(57) ABSTRACT

A method of manufacturing a MOS device includes: providing a substrate having a source region and a drain region; forming a sandwich structure on the substrate, which includes a first $SiO_2$ layer, a high-k dielectric layer, and a second $SiO_2$ layer stacked sequentially from bottom up; forming a groove in the sandwich structure between the source region and the drain region, the depth of the groove extends from a top surface of the second $SiO_2$ layer to inside the sandwich structure, wherein the depths at two sides of the groove are shallower than the depth at the center of the groove; forming a gate conductive layer, which fills the groove, wherein a top surface of the gate conductive layer is higher than that of the second $SiO_2$ layer; and forming a sidewall structure on sidewalls of the gate conductive layer.

10 Claims, 5 Drawing Sheets

MOS DEVICE WITH SANDWICH STRUCTURE AND GROOVE

FIELD OF INVENTION

The present disclosure relates to the technical field of semiconductor integrated circuits, and more particularly, to a MOS device and a manufacturing method thereof.

BACKGROUND

As shown in FIG. 1, a gate oxide structure in the existing semiconductor manufacturing technology generally includes a substrate 101, a source 102, a drain 103, a gate oxide layer 104, a polysilicon gate 105, sidewalls 106 and an interfacial layer between each sidewall 106 and the gate 105.

Turn-on voltages and breakdown voltages of MOS devices are important criteria for judging performance of the MOS devices. How to determine appropriate turn-on voltages and increase breakdown voltages of MOS devices are also important tasks in the development of modern MOS devices.

Basic characteristics of a MOS device, such as its turn-on voltage and breakdown voltage, are closely related to the channel length of the MOS device and the thickness of its gate silicon oxide. Generally, it is desirable for a MOS device to have a high breakdown voltage while retaining a good current-driving capability.

Therefore, how to improve structural designs of MOS devices so as to increase breakdown voltages of MOS devices while minimizing any negative impact of increased breakdown voltages on turn-on voltages of the corresponding MOS devices has become an important technical issue to be solved by those skilled in the art.

SUMMARY

The present disclosure provides a method of manufacturing a MOS device includes: providing a substrate, wherein a source region and a drain region are arranged in the substrate and spaced apart along a first direction parallel to the substrate; forming a sandwich structure on the substrate, wherein the sandwich structure has a first $SiO_2$ layer, a high-k dielectric layer over the first $SiO_2$ layer, and a second $SiO_2$ layer over the high-k dielectric layer; forming a groove in the sandwich structure between the source region and the drain region, wherein a width of the groove is arranged along the first direction, wherein a depth of the groove extends from an upper surface of the second $SiO_2$ layer and ends inside the sandwich structure, and wherein depths at two sides of the groove are shallower than a depth at a center of the groove; forming a gate conductive layer, wherein the gate conductive layer fills the groove, wherein a top surface of the gate conductive layer is arranged to be higher than a top surface of the second $SiO_2$ layer; and forming a sidewall structure on sidewalls of the gate conductive layer.

In an example, the step of forming the groove comprises forming a first photoresist layer on the second $SiO_2$ layer; forming a photoresist layer opening in the first photoresist layer, wherein the photoresist layer opening is located between the source region and the drain region in the first direction, and wherein the photoresist layer opening partially exposes the second $SiO_2$ layer; and etching the second $SiO_2$ layer and the high-k dielectric layer using the first photoresist layer as a mask to pattern the groove.

In an example, a bottom surface of the groove is in the shape of a concave arc.

In an example, a bottom surface of the groove is not lower than the top surface of the first $SiO_2$ layer.

In an example, the step of forming the gate conductive layer comprises forming a conductive material layer on the second $SiO_2$ layer and in the groove respectively; forming a second photoresist layer on the conductive material layer; patterning the second photoresist layer to expose portions of the conductive material layer over the source region and the drain region, wherein a portion of the conductive material layer over the groove is still shielded by the second photoresist layer after patterning; and etching the conductive material layer using the second photoresist layer as a mask until the second $SiO_2$ layer is partially exposed, wherein the portion of the conductive material layer shielded by the second photoresist layer is not etched and forms the gate conductive layer.

In an example, a width of the gate conductive layer is larger than a width of the groove, and the two sides of the gate conductive layer are in contact with the top surface of the second $SiO_2$ layer.

In an example, the manufacturing method further comprises: removing regions of the sandwich structure that are not shielded by either the sidewall structure or the gate conductive layer.

In an example, the first $SiO_2$ layer is formed by thermal oxidation.

The embodiment of the present application also provides a MOS device that includes a substrate, wherein a source region and a drain region are arranged in the substrate and are spaced apart in a first direction; a sandwich structure, wherein the sandwich structure is disposed on the substrate, wherein the sandwich structure comprises a first $SiO_2$ layer, a high-k dielectric layer over the first $SiO_2$ layer, and a second $SiO_2$ layer over the high-k dielectric layer; a groove, wherein the groove is disposed in the sandwich structure between the source region and the drain region, wherein a width of the groove is arranged along the first direction; wherein the groove extends from a top surface of the second $SiO_2$ layer and ends inside the sandwich structure, and wherein depths at two sides of the groove are shallower than a depth at a center of the groove; a gate conductive layer, which fills in the groove, and wherein a top surface of the gate conductive layer is higher than the top surface of the second $SiO_2$ layer; and a sidewall structure which is located on sidewalls of the gate conductive layer.

In an example, a bottom surface of the groove is in the shape of a concave arc.

In an example, a bottom surface of the groove is not lower than the top surface of the first $SiO_2$ layer.

In an example, a width of the gate conductive layer is larger than a width of the groove, and the two sides of the gate conductive layer are in contact with the top surface of the second $SiO_2$ layer.

In summary, in the MOS device of the present disclosure, the gate dielectric layer is a sandwich structure composed of $SiO_2$/high-k dielectric layer/$SiO_2$; the high-k dielectric layer in the middle aids in preventing breakdown and increasing breakdown voltage of the MOS device; the upper and lower $SiO_2$ layers reduce interface strains, and maintain high matching degrees between the gate oxide and substrate, and between the gate oxide and gate conductive layer. In the MOS device structure of the present disclosure, the gate dielectric layer is also designed to be thin in the center and thick at two sides; the thicker sides mitigate the influence of source and drain voltages in edges of the source region and the drain region, thereby increasing the breakdown voltage, while the thinner middle can ensure that the conductive channel can still be turned on at a low voltage as usual, so that the turn-on voltage has no obvious difference from that of a traditional structure. That is, the present disclosure can increase the breakdown voltage of the MOS device without affecting its turn-on voltage.

DETAILED DESCRIPTION

Figure 1:
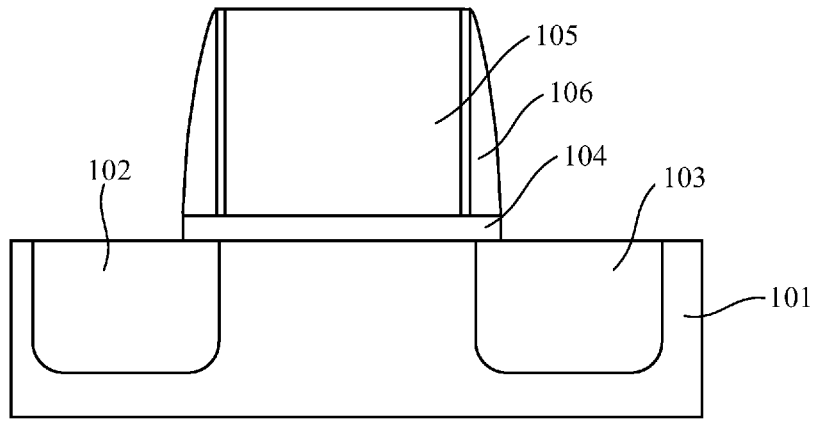
FIG. 1 is a diagram illustrating a cross-sectional view of a MOS device.

The following specific examples illustrate examples of the present disclosure, and those skilled in the art can easily understand other advantages and efficacy of the present disclosure from the disclosure of the present application. The present application can also be implemented or applied in other different examples. The details in the present application can be modified or changed based on different viewpoints and usages without departing from the spirit of the present application.

Refer to FIG. 1 to FIG. 11. It should be noted that the drawings provided are only to illustrate the basic concept of the present disclosure, and thus the components in the drawings are not necessarily drawn according to the actual quantity, shape or size in actual implementation. The type, quantity and proportion of each component in actual implementation can be modified as needed, and the layout of the components may be more complicated than that shown in the drawings. Herein, a horizontal direction refers to a direction parallel to the substrate of the device, and a vertical direction refers to a direction perpendicular to the substrate of the device.

Embodiment 1

Figure 2:
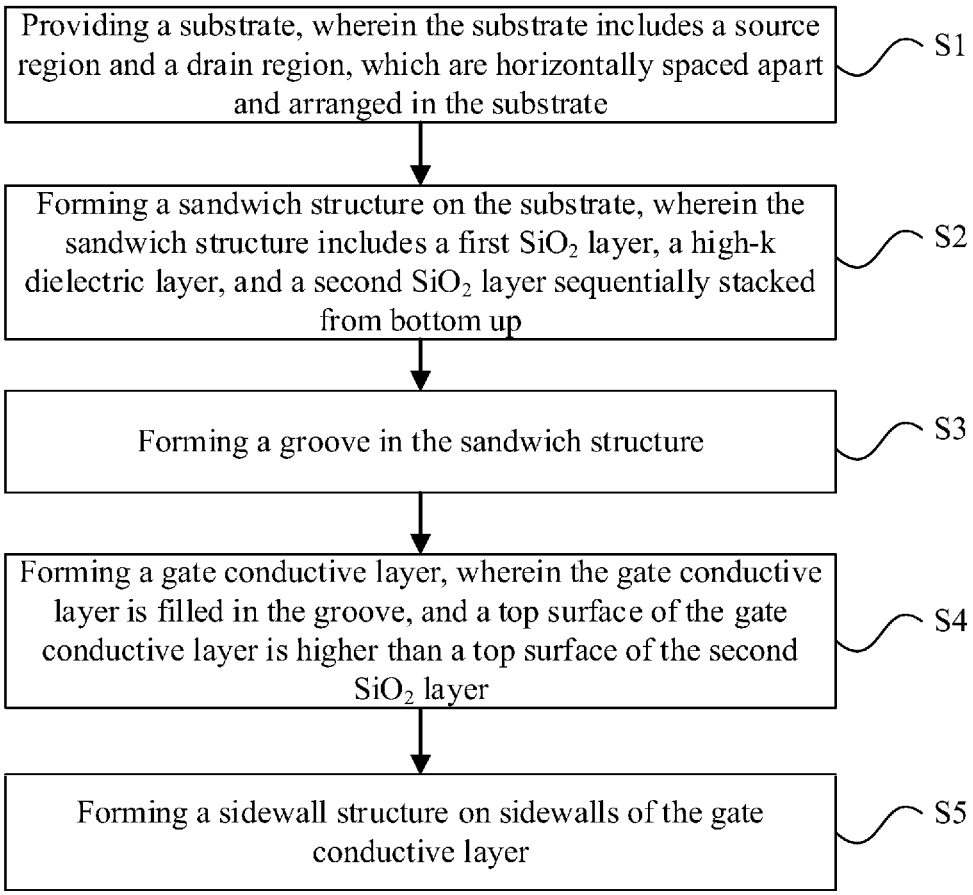
FIG. 2 is a flowchart illustrating a manufacturing method of a MOS device according to an example of the present disclosure.

Embodiment 1 provides a manufacturing method of a MOS device. FIG. 2 shows a flowchart illustrating the manufacturing method of the MOS device according to the present disclosure. The manufacturing method includes:

Step S1: providing a substrate, wherein the substrate includes a source region and a drain region, which are arranged spaced apart horizontally along the direction parallel to the substrate;

Step S2: forming a sandwich structure on the substrate, wherein the sandwich structure includes a first $SiO_2$ layer, a high-k dielectric layer, and a second $SiO_2$ layer sequentially stacked from bottom up;

Step S3: forming a groove in the sandwich structure, wherein the groove extends from an upper surface of the second $SiO_2$ layer and ends inside the sandwich structure, wherein the groove is located between the source region and the drain region in the horizontal direction, wherein the depth at the two sides of the groove is shallower than the depth at the center part of the groove, wherein the direction from one side to the other end of the two sides is parallel to the direction pointing from the source region to the drain region;

Step S4: forming a gate conductive layer, wherein the groove is filled with the gate conductive layer, and a top surface of the gate conductive layer is higher than a top surface of the second $SiO_2$ layer; and Step S5: forming a sidewall structure on sidewalls of the gate conductive layer.

Figure 3:
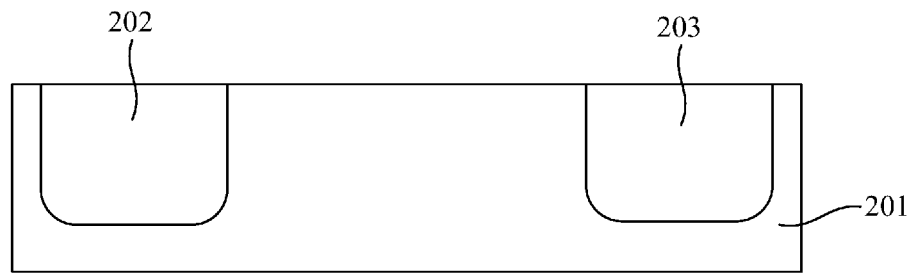
FIG. 3 is a cross-sectional view of a substrate provided in a step of a manufacturing method of a MOS device of the present disclosure.

The details of Step S1 can be referred to FIG. 3. In FIG. 3, a substrate 201 is provided, in which a source region 202 and a drain region 203 are arranged spaced apart from each other horizontally along a direction parallel to the substrate.

For example, a material of the substrate 201 may include, but is not limited to, semiconductor materials such as silicon, germanium, silicon-germanium, silicon-on-insulator, and III-V compounds. The source region 202 and the drain region 203 can be formed by ion implantation into predetermined regions of the substrate 201. The source region 202 and the drain region 203 have the same dopant type. For example, the substrate 201 may be a P-type silicon substrate, and both the source region 202 and the drain region 203 may be N-type regions.

Figure 4:
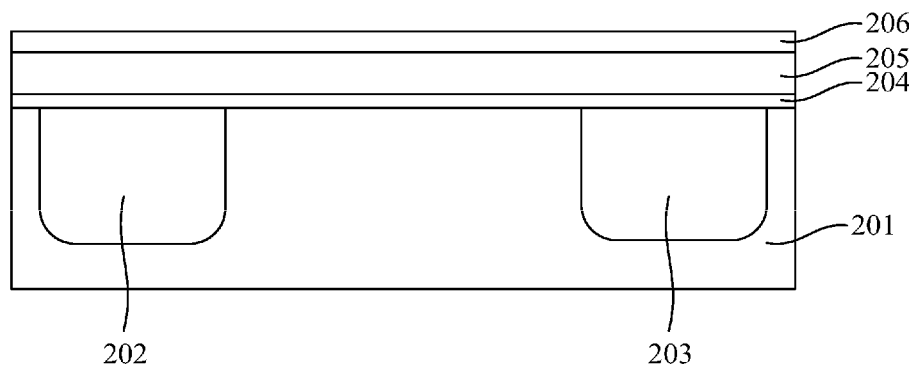
FIG. 4 is a cross-sectional view of illustrating a sandwich structure on a substrate post the step of forming it according to a manufacturing method of a MOS device of the present disclosure.

For more details of Step S2, refer to FIG. 4. In FIG. 4, formed on the substrate 201, the sandwich structure includes the first $SiO_2$ layer 204, the high-k dielectric layer 205 and the second $SiO_2$ layer 206 sequentially stacked up from the bottom layer.

For example, an ultra-thin $SiO_2$ layer can be grown by thermal oxidation to form the first $SiO_2$ layer 204 on the surface of the substrate 201. In this example, a thickness of the first $SiO_2$ layer 204 may range from 10 to 50 angstroms (Å).

For example, the high-k dielectric layer 205 and the second $SiO_2$ layer 206 may be formed using chemical vapor deposition (CVD), physical vapor deposition (PVD) or other suitable methods. The dielectric constant of the high-k dielectric layer 205 is greater than 3.9, and its material includes, but is not limited to, at least one of nitrogen-doped silicon oxide, silicon nitride, hafnium oxide, aluminum oxide, and zirconium oxide. In this example, a thickness of the high-k dielectric layer 205 may range from 50 Å to 200 Å.

Figure 5:
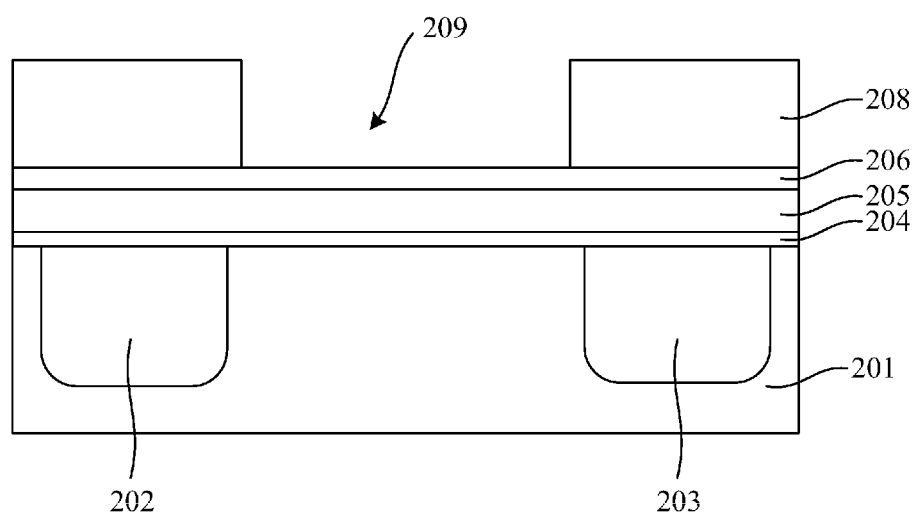
FIG. 5 is a cross-sectional view of illustrating a first photoresist layer on a second $SiO_2$ layer post the step of patterning the first photoresist layer, according to a manufacturing method of a MOS device of the present disclosure.
Figure 6:
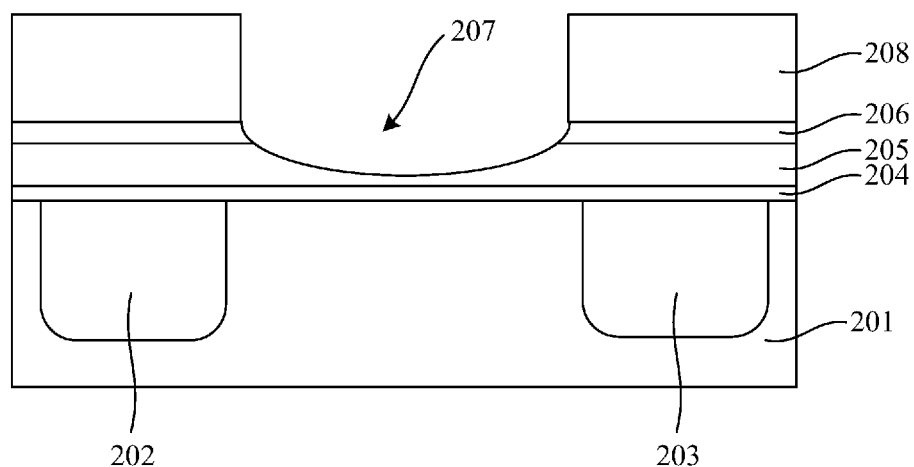
FIG. 6 is a cross-sectional view of illustrating a groove acquired with a first photoresist layer as a mask post the step of etching a second $SiO_2$ layer and a high-k dielectric layer to obtain it, according to a manufacturing method of a MOS device of the present disclosure.

Details of structures after Step S3 are shown in FIG. 5 and FIG. 6. As shown in FIG. 5 and FIG. 6, the groove 207 is formed in the sandwich structure, wherein the groove 207 extends from the upper surface of the second SiO$_2$ layer 206 and ends inside the sandwich structure. The groove 207 is located between the source region 202 and the drain region 203 in the horizontal direction, and the two sides of the groove 207 are shallower than the center of the groove 207, wherein the direction from one sides to the other side of the two sides is parallel to the direction pointing from the source region 203 to the drain region 202.

For example, the step of forming the groove 207 may further include:

Step S3-1: forming a first photoresist layer 208 on the second SiO$_2$ layer 206 using spin coating or other suitable methods;

Step S3-2: (as shown in FIG. 5) forming a photoresist layer opening 209 in the first photoresist layer 208 using photolithography processes including exposure, development, etc. The photoresist layer pattern opening 209 is located between the source region 202 and the drain region 203 in the horizontal direction, and the photoresist layer opening 209 partially exposes the second SiO$_2$ layer 206;

Step S3-3: (as shown in FIG. 6) etching the second SiO$_2$ layer 206 and the high-k dielectric layer 205 using the first photoresist layer 208 (with the photoresist layer opening 209) as a mask, to obtain the groove 207.

For example, in one particular example, the groove 207 can be formed by wet etching, wherein the wet etching may be isotropic etching, and a bottom surface of the groove 207 may be in the shape of a concave arc, with two shallower sides and a deeper center.

For example, in another example, the groove 207 can be obtained using wet etching combined with dry etching.

For example, the bottom surface of the groove 207 is not lower than the top surface of the first SiO$_2$ layer 204, thus ensuring the integrity of the first SiO$_2$ layer 204.

For example, the bottom surface of the groove 207 extends into the high-k dielectric layer 205.

Figure 7:
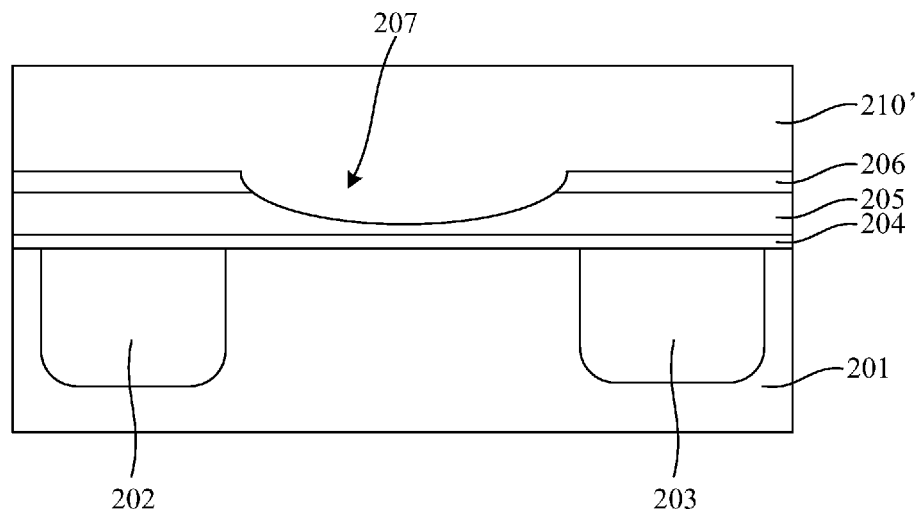
FIG. 7 is a cross-sectional view of illustrating a conductive material layer on a second $SiO_2$ layer and in a groove post the step of forming it, according to a manufacturing method of a MOS device of the present disclosure.
Figure 8:
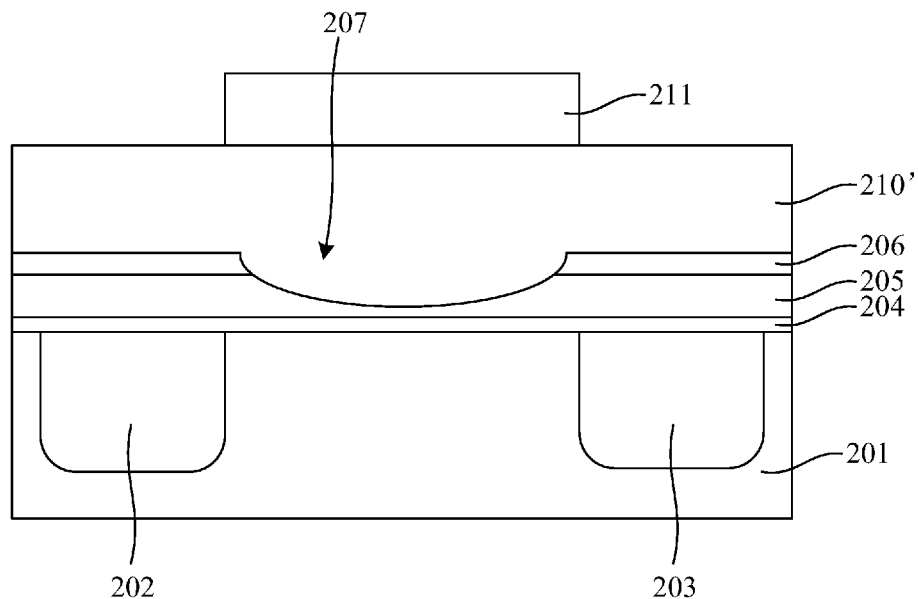
FIG. 8 is a cross-sectional view of illustrating a second photoresist layer on a conductive material layer post the step of patterning the second photoresist layer, according to a manufacturing method of a MOS device of the present disclosure.
Figure 9:
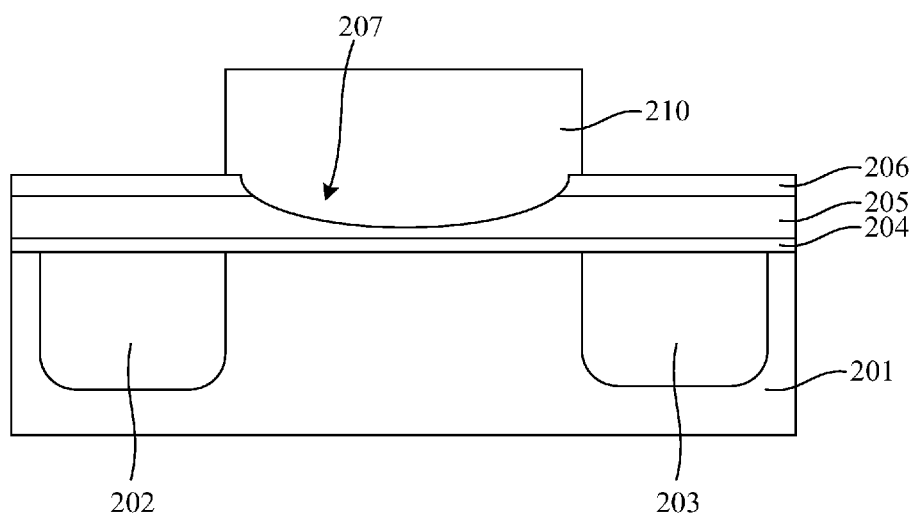
FIG. 9 is a cross-sectional view of illustrating a conductive material layer with a second $SiO_2$ layer exposed post the step of etching the layer, according to a manufacturing method of a MOS device of the present disclosure.

More details of Step S4 are shown in FIGS. 7-9. As shown in FIGS. 7-9, the first photoresist layer 208 is removed, and a gate conductive layer 210 is formed. The gate conductive layer 210 is filled in the groove 207, and a top surface of the gate conductive layer 210 is higher than the top surface of the second SiO$_2$ layer 206.

For example, a width of the gate conductive layer 210 may be smaller than, equal to, or larger than a width of the groove 207, with the widths extending in a direction parallel to the substrate. In one example, the width of the gate conductive layer 210 is preferably larger than the width of the groove 207. In the direction pointing from the source region 202 to the drain region 203, bottom surfaces of two ends of the gate conductive layer 210' are in contact with the top surface of the second SiO$_2$ layer 206, which helps to reduce the contact area between the two ends of the gate conductive layer 210 and a gate dielectric layer.

For example, the gate conductive layer 210 may be formed using following steps:

S4-1: (as shown in FIG. 7) forming a conductive material layer 210' on the second SiO$_2$ layer 206 and in the groove 207 using CVD, PVD or other suitable methods, and the material of the conductive material layer 210' includes, but is not limited to, polysilicon;

S4-2: forming a second photoresist layer 211 on the conductive material layer 210' using spin coating or other suitable methods;

S4-3: (as shown in FIG. 8) patterning the second photoresist layer 211 using photolithography processes including exposure, development, etc., to expose portions of the conductive material layer 210' over the source region 202 and the drain region 203, while a portion of the conductive material layer 210' over the groove 207 is still shielded by the second photoresist layer 211 after patterning.

S4-4: (as shown in FIG. 9) etching the conductive material layer 210' using the second photoresist layer 211 as a mask until the second SiO$_2$ layer 206 is partially exposed, while the region of the conductive material layer 210' shielded by the patterned second photoresist layer 211 is not etched and forms the gate conductive layer 210.

Figure 10:
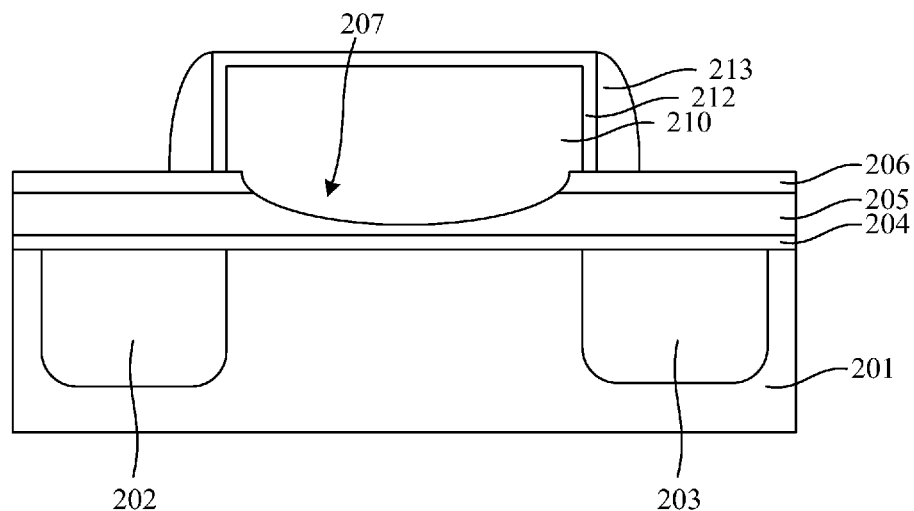
FIG. 10 is a cross-sectional view of illustrating a sidewall structure on sidewalls of a gate conductive layer post the step of forming it, according to a manufacturing method of a MOS device of the present disclosure.
Figure 11:
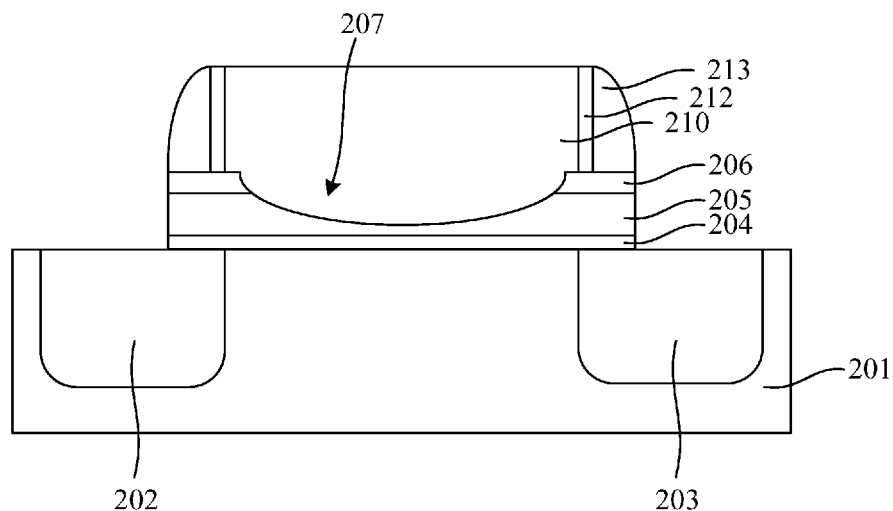
FIG. 11 is a cross-sectional view of illustrating the sandwich structure post the step of removing regions of the sandwich structure which are not shielded by either a sidewall structure or a gate conductive layer, according to a manufacturing method of a MOS device of the present disclosure.

Details of Step S5 are shown in FIG. 10 and FIG. 11. As shown in FIG. 10 and FIG. 11, the sidewall structure is formed on the sidewalls of the gate conductive layer 210.

For example, as shown in FIG. 10, surfaces of the gate conductive layer 210 are oxidized to obtain an oxide layer 212, and a silicon nitride layer 213 is deposited on surfaces of the oxide layer 212 to obtain the sidewall structure including the oxide layer 212 and the silicon nitride layer 213. Then, as shown in FIG. 11, wet etching and/or dry etching can be used to remove the region of the sandwich structure that is not covered by either the sidewall structure or the gate conductive layer 210, wherein the region of the sandwich structure covered by the sidewall structure and the gate conductive layer 210 remains, and serves as a gate dielectric layer.

In the manufacturing method of the MOS device, a relatively thick multi-material sandwich structure is first formed, and then etched to obtain a gate dielectric layer that is thin in the middle and thick at two ends. Such a design increases the breakdown voltage of the MOS device and mitigates the negative impact of the thickness of the gate dielectric layer on the turn-on voltage of the MOS device. The breakdown voltage is further increased by adding a high-k dielectric layer.

Embodiment 2

This embodiment provides a MOS device, which may be manufactured using the methods in Embodiment 1 or other suitable methods.

Referring to FIG. 11 which shows a MOS device. The MOS device comprises a substrate 201, a sandwich structure, a groove 207, a gate conductive layer 210, and a sidewall structure. A source region 202 and a drain region 203 are arranged in the substrate 201, and spaced apart in a direction parallel to the substrate. The sandwich structure is located on the substrate 201, and comprises a first SiO$_2$ layer 201, a high-k dielectric layer 205, and a second SiO$_2$ layer 206 stacked sequentially from bottom up. The groove 207 is located in the sandwich structure, and extends from an upper surface of the second SiO$_2$ layer 206 and ends inside the sandwich structure. The groove 207 is located between the source region 202 and the drain region 203 in a horizontal direction, and two sides of the groove 207 are shallower than the center of the groove 207, wherein the direction from one end to the other end of the two ends is parallel to the direction pointing from the source region 202 to the drain region 203. The gate conductive layer 210 fills in the groove 207, and a top surface of the gate conductive layer 210 is higher than a top surface of the second $SiO_2$ layer 206. The sidewall structure is located on sidewalls of the gate conductive layer 210.

For example, the sidewall structure comprises an oxide layer 212, and a silicon nitride layer 213 formed on surfaces of the oxide layer 212.

For example, a bottom surface of the groove 207 is in the shape of a concave arc.

For example, the bottom surface of the groove 207 is not lower than the top surface of the first $SiO_2$ layer 206.

For example, a width of the gate conductive layer 210 may be smaller than, equal to or larger than a width of the groove 207. In an example, the width of the gate conductive layer 210 is preferably larger than the width of the groove 207. Bottoms surfaces of both ends of the gate conductive layer 210 are in contact with the top surface of the second $SiO_2$ layer 206, which reduces potential defects in the contact regions between the two ends of the gate conductive layer 210 and the gate dielectric layer.

In summary, in the MOS device of the present disclosure, the gate dielectric layer is a sandwich structure composed of $SiO_2$/high-k dielectric layer/$SiO_2$; the high-k dielectric layer in the middle aids in preventing breakdown and increasing breakdown voltage of the MOS device; the upper and lower $SiO_2$ layers reduce interface strains, and maintain high matching degrees between the gate oxide and substrate, and between the gate oxide and gate conductive layer. In the MOS device structure of the present disclosure, the gate dielectric layer is also designed to be thin in the middle and thick at two ends; the thicker ends mitigate the influence of source and drain voltages in edges of the source region and the drain region, thereby increasing the breakdown voltage, while the thinner middle can ensure that the conductive channel can still be turned on at a low voltage as usual, so that the turn-on voltage has no obvious difference from that of a traditional structure. That is, the present disclosure can increase the breakdown voltage of the MOS device without affecting its turn-on voltage. As a result, the present application effectively overcomes various shortcomings in the prior art, and is of high industrial utilization value.

The above examples only illustrate the principle and efficacy of the present disclosure, and are not meant to limit the present disclosure. Any skilled in the art can modify or change the above embodiments without departing from the spirit and scope of the present disclosure. Therefore, all equivalent modifications or changes made by those skilled in the art without departing from the spirit and technical ideology of the present disclosure shall fall within the claimed scope of the present disclosure.

What is claimed is:

1. A method of manufacturing a MOS device, comprising:
    providing a substrate, wherein a source region and a drain region are arranged in the substrate and spaced apart along a first direction parallel to the substrate;
    forming a sandwich structure on the substrate, wherein the sandwich structure comprises a first $SiO_2$ layer, a high-k dielectric layer over the first $SiO_2$ layer, and a second $SiO_2$ layer over the high-k dielectric layer;
    forming a groove in the sandwich structure between the source region and the drain region, wherein a width of the groove is arranged along the first direction, wherein a depth of the groove extends from an upper surface of the second $SiO_2$ layer and ends inside the sandwich structure, and wherein depths at two sides of the groove are shallower than a depth at a center of the groove; wherein a bottom surface of the groove is not lower than a top surface of the first $SiO_2$ layer;
    forming a gate conductive layer, wherein the gate conductive layer fills the groove, wherein a top surface of the gate conductive layer is arranged to be higher than a top surface of the second $SiO_2$ layer; and
    forming a sidewall structure on sidewalls of the gate conductive layer.

2. The method of manufacturing the MOS device according to claim 1, wherein a step of forming the groove comprises:
    forming a first photoresist layer on the second $SiO_2$ layer;
    forming a photoresist layer opening in the first photoresist layer, wherein the photoresist layer opening is located between the source region and the drain region in the first direction, and wherein the photoresist layer opening partially exposes the second $SiO_2$ layer; and
    etching the second $SiO_2$ layer and the high-k dielectric layer using the first photoresist layer as a mask to pattern the groove.

3. The method of manufacturing the MOS device according to claim 1, wherein the bottom surface of the groove is in the shape of a concave arc.

4. The method of manufacturing the MOS device according to claim 1, wherein the step of forming the gate conductive layer comprises:
    forming a conductive material layer on the second $SiO_2$ layer and in the groove respectively;
    forming a second photoresist layer on the conductive material layer;
    patterning the second photoresist layer to expose portions of the conductive material layer over the source region and the drain region, wherein a portion of the conductive material layer over the groove is still shielded by the second photoresist layer after patterning; and
    etching the conductive material layer using the second photoresist layer as a mask until the second $SiO_2$ layer is partially exposed, wherein the portion of the conductive material layer shielded by the second photoresist layer is not etched and forms the gate conductive layer.

5. The method of manufacturing the MOS device according to claim 1, wherein a width of the gate conductive layer is larger than the width of the groove, and wherein two ends of the gate conductive layer are in contact with the top surface of the second $SiO_2$ layer.

6. The method of manufacturing the MOS device according to claim 1, further comprising: removing regions of the sandwich structure that are not shielded by either the sidewall structure or by the gate conductive layer.

7. The method of manufacturing the MOS device according to claim 1, wherein the first $SiO_2$ layer is formed by thermal oxidation.

8. A MOS device, comprising:
    a substrate, wherein a source region and a drain region are arranged in the substrate and are spaced apart in a first direction;
    a sandwich structure, wherein the sandwich structure is disposed on the substrate, wherein the sandwich structure comprises a first $SiO_2$ layer, a high-k dielectric layer over the first $SiO_2$ layer, and a second $SiO_2$ layer over the high-k dielectric layer;
    a groove, wherein the groove is disposed in the sandwich structure between the source region and the drain region, wherein a width of the groove is arranged along the first direction; wherein the groove extends from a top surface of the second $SiO_2$ layer and ends inside the sandwich structure, and wherein depths at two sides of the groove are shallower than a depth at a center of the groove;

a gate conductive layer, which fills in the groove, wherein a top surface of the gate conductive layer is higher than the top surface of the second $SiO_2$ layer; and a sidewall structure which is located on sidewalls of the gate conductive layer;

wherein a bottom surface of the groove is not lower than a top surface of the first $SiO_2$ layer.

9. The MOS device according to claim 8, wherein the bottom surface of the groove is in a shape of a concave arc.

10. The MOS device according to claim 8, wherein a width of the gate conductive layer is larger than a width of the groove, and wherein two sides of the gate conductive layer are in contact with the top surface of the second $SiO_2$ layer.

* * * * *